United States Patent
Assadi et al.

(10) Patent No.: US 6,540,946 B1
(45) Date of Patent: Apr. 1, 2003

(54) MICROLENS FOR SURFACE MOUNT PRODUCTS

(75) Inventors: Azar Assadi, Tempe, AZ (US); Parvin Mossahebi, Scottsdale, AZ (US); Kabul Sengupta, Tempe, AZ (US)

(73) Assignee: Intel Corporation, Santa Clara, CA (US)

(*) Notice: Subject to any disclaimer, the term of this patent is extended or adjusted under 35 U.S.C. 154(b) by 225 days.

(21) Appl. No.: 09/679,005

(22) Filed: Oct. 4, 2000

Related U.S. Application Data

(62) Division of application No. 09/324,880, filed on Jun. 3, 1999, now Pat. No. 6,297,540.

(51) Int. Cl.[7] .............................................. B29D 11/00
(52) U.S. Cl. ...................................... 264/1.38; 264/2.6
(58) Field of Search ............................... 264/1.38, 1.36, 264/2.1, 2.6

(56) References Cited

U.S. PATENT DOCUMENTS

| 5,442,482 A | * | 8/1995 | Johnson et al. |
| 6,083,429 A | * | 7/2000 | Wester ...................... 264/1.38 |
| 6,271,900 B1 | * | 8/2001 | Li |

* cited by examiner

Primary Examiner—Mathieu D. Vargot
(74) Attorney, Agent, or Firm—Trop, Pruner & Hu, P.C.

(57) ABSTRACT

A photosensitive device with a microlens array may be packaged for surface mount packaging and subsequent mass reflow processing without significantly degrading the optical performance of the microlens. The microlens may be formed using a series of heat steps of increasing time and temperature. In addition, the microlens may be bleached to prevent degradation of its optical transmissivity at temperatures normally associated with surface mount techniques.

3 Claims, 3 Drawing Sheets

MICROLENS FOR SURFACE MOUNT PRODUCTS

This is a divisional of prior application Ser. No. 09/324,880 filed Jun. 3, 1999, now U.S. Pat. No. 6,297,540.

BACKGROUND

This invention relates generally to photosensitive devices and in particular to the use of microlens arrays to increase the fill factor of such photosensitive devices.

Currently, surface mount packaging is enjoying considerable commercial acceptance in large part due to the fact that high volume connections may be made to circuit boards in a low cost fashion. In one such surface mount integrated circuit packaging technique, known as Quad Flat Package (QFP), the package may be connected to a circuit board, such as a printed circuit board (PCB), simply by positioning the package on the board and applying heat. The heat melts a plurality of contacts on one surface of the package, connecting the package to the board. This technique enables integrated circuits to be connected to circuit boards in an automated fashion at high speed and low cost.

Integrated circuit image sensors are also gaining increasing acceptance. Complementary metal oxide semiconductor (CMOS) imaging devices may be formed using conventional logic semiconductor fabrication processes. These devices can be made at high speed and at relatively low cost, producing devices with advanced electronic functions, in addition to the imaging functions.

A variety of photosensitive devices increase their fill factors with microlens arrays. The fill factor is a measure of the amount of incident light which actually makes its way onto the image sensing array. The microlens operates as a miniature lens, focusing light on each pixel making up the image sensing array.

Microlenses may be made of positive photoresist or sol gel. These microlens arrays may be formed directly on top of the image sensor, for example, by positioning the microlens array on top of a color filter array (CFA) which is situated over the image sensing array. Alternatively, the microlenses may be spaced over the image sensing array. In any case, the microlenses are generally heat sensitive and therefore have not been used, so far as the present inventors are aware, with surface mount packaging. It is believed that conventional surface mount packaging, which involves temperatures on the order of 225° C. for a matter of minutes adversely affects conventional microlens arrays.

Therefore, there is a continuing need for techniques for enabling low cost packaging techniques to be applied to photosensitive devices with acceptable fill factors achieved using microlens arrays.

SUMMARY

In accordance with one aspect, a method for forming a microlens includes forming a photosensitive device. A microlens is arranged over the device and the device is packaged. The packaged device is then exposed to a surface mount mass reflow.

DETAILED DESCRIPTION

Figure 1:
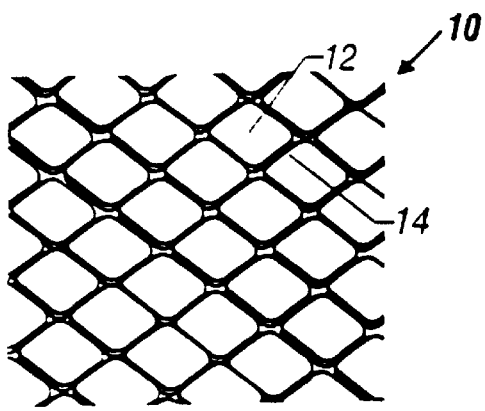
FIG. 1 is a perspective view of one embodiment of a microlens array in accordance with one embodiment of the present invention.

Referring to FIG. 1, a microlens array 10 may include a plurality of microlenses 12 separated by channels 14 in accordance with one embodiment of the present invention. With the illustrated microlenses 12, the rectangular or square shape decreases the amount of space wasted by the channels 14 and thereby improves the fill factor. The precise dome shape of the microlenses 12 may be adjusted by increasing or decreasing the curvature compared to that shown. In addition to rectangular microlenses, other conventional shapes may be used as well including circular, hemispherical microlenses.

The microlens array 10 can be formed of a substantially light transmissive, positive photoresist, such as novalac. The array 10 may withstand the mass reflow temperature steps involved in coupling surface mount packages to circuit boards. With conventional microlenses, the optical characteristics of the microlens would be degraded when exposed the high surface mount temperatures that adversely affect the transmissivity of the lens and its shape. An improved photosensitive device using the microlens array 10 may make use of popular, low cost surface mount packaging processes.

Figure 2:
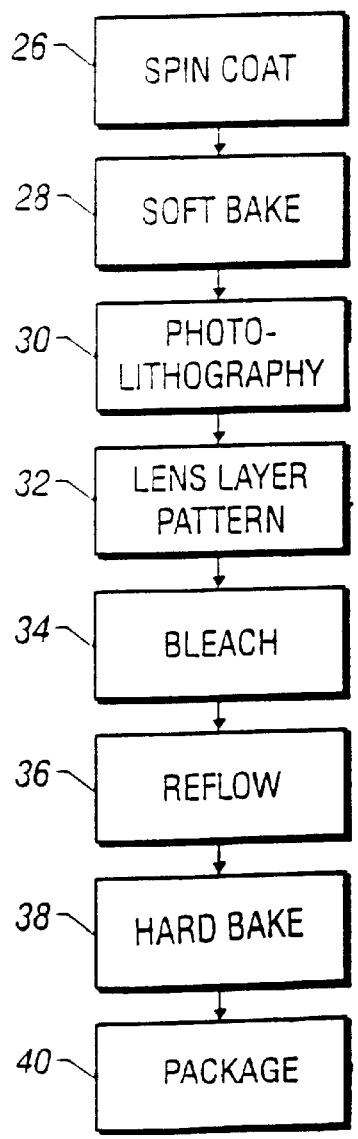
FIG. 2 is a flow diagram showing the steps used in one embodiment of the present invention to form microlenses using mass reflow techniques.

Referring to FIG. 2, initially the material utilized to form the microlens is spin coated on an appropriate surface such as a CFA layer, a glass substrate or in some cases directly on a photosensitive device, as indicated at 26. While FIG. 2 illustrates the use of spin coating to deposit the material forming the microlenses, other known techniques may be utilized as well. Next, the coated material is subjected to a soft bake step, illustrated at 28. In one embodiment of the present invention, the microlens forming material may be coated to a thickness of about 3 microns and may be subjected to a soft bake step using a temperature of about 100° C., for example 110° C. for 540 milliseconds. The amount of time and temperature utilized for the soft bake step may be variable and may be a function of the thickness of the coated material. Thereafter the baked coating is subjected to photolithography, as indicated at 30 in FIG. 2.

Figure 3:
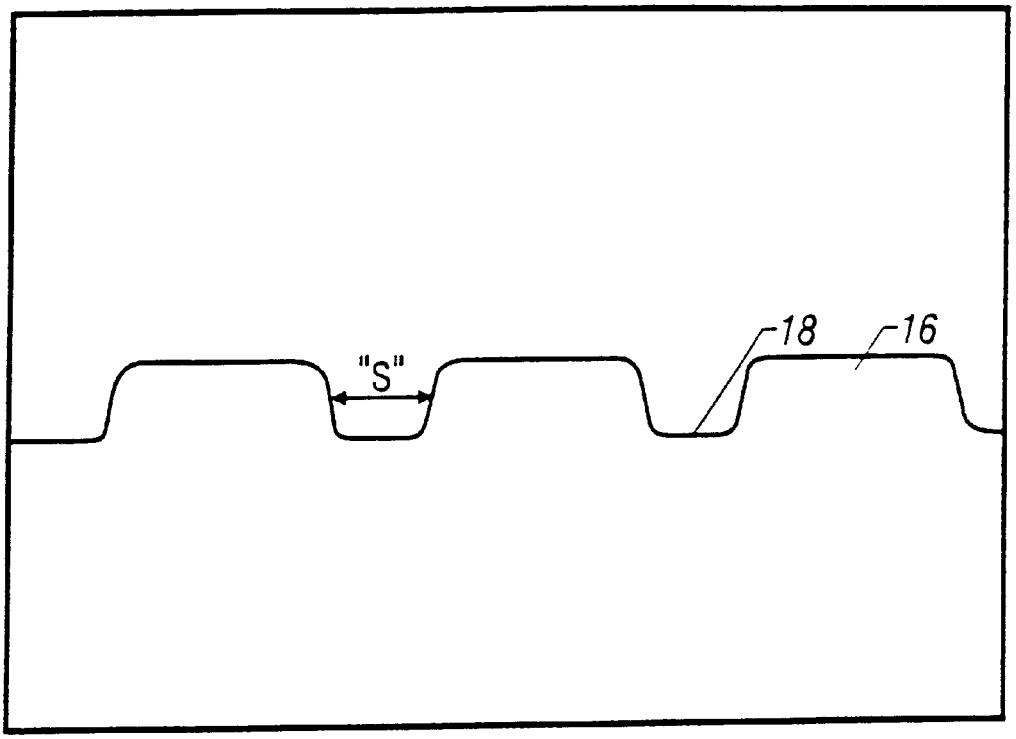
FIG. 3 is a cross-sectional view of the array shown in FIG. 2 after a heat-processing step.

Following photolithography, the blocks 16 (which will become microlenses) may take the shape shown in FIG. 3 in one embodiment of the invention. In such case, the blocks are separated from one another by a trough 18 which may have a width of about 3.5 microns. Walls may be formed with a slope of about 3. In the embodiment illustrated, each of the blocks 16 has a length of about 9 microns. The blocks are patterned using conventional techniques such as photoresist processing techniques, as indicated at block 32.

The microlens blocks 16 are then bleached as indicated in block 34. The bleaching process is useful in preventing degradation of the microlenses when exposed to higher temperatures and to improving transmissivity.

The bleaching may be a quick bleach step on the order of 5 to 10 seconds, and in one embodiment the duration is from 6 to 7 seconds. The bleaching is done using deep ultraviolet (DUV) wavelength radiation that produces wavelengths of 350 to 430 nm., for example. A UV filter passes wavelengths above about 400 nm. This permits the bleaching time to be reduced compared to conventional bleaching, using broadband radiation, which may take on the order of thirty seconds. The DUV bleaching using wavelengths greater than 400 nm. is very effective in removing photoactive material from the photoresist material. The photoactive material is believed to be responsible for yellowing, transmissivity loss, and heat instability.

Figure 4:
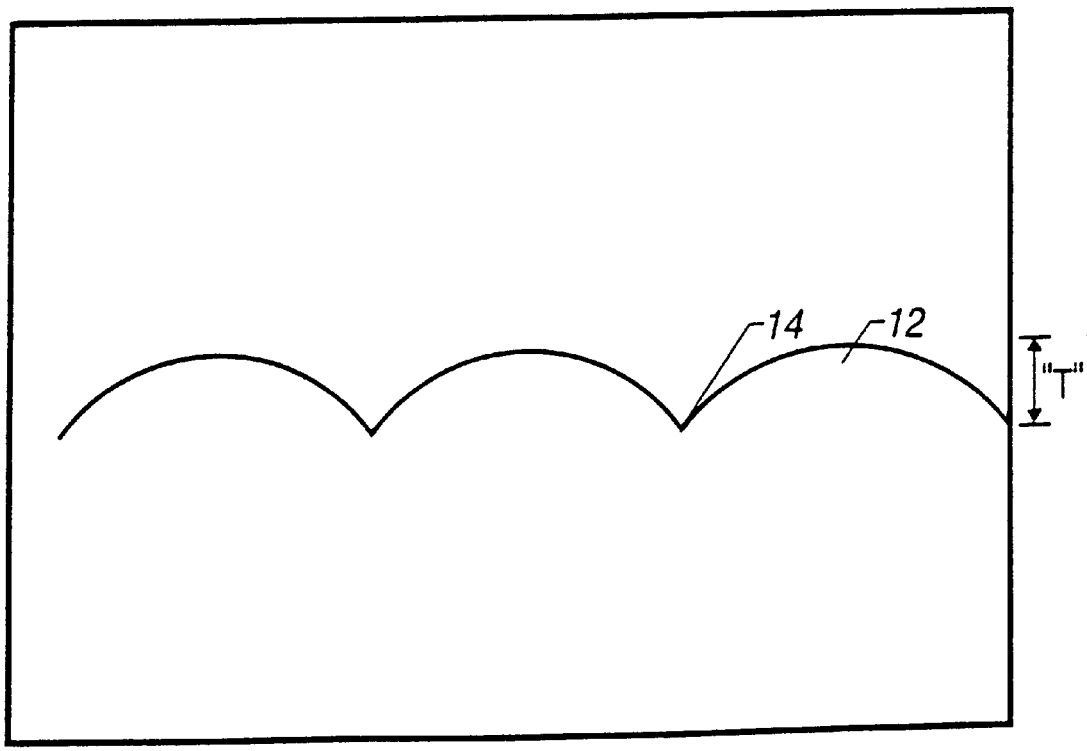
FIG. 4 is a cross-sectional view of a microlens array in the process of being fabricated.

The bleached blocks 16 are then subjected to a reflow step 36. In one embodiment of the invention, the reflow step may involve temperatures of about 150° C., for example 160° C. for about 120 seconds. As a result, the blocks shown in FIG. 3 melt to form the shape shown in FIG. 4. The microlenses 12 are separated by channels 14. The height T of the microlenses 12, in one embodiment of the present invention, may be about 2.8 microns and the lenses 12 may have a length of about 11.5 microns.

The lenses may now be exposed to a hard bake step (block 38) at a temperature of about 200° C., for example 225° C. for about 2–3 minutes. Conventional processing generally optimizes the spacing between the individual microlenses, particularly to avoid overlapping. By optimizing instead for heat stability, a heat stable microlens may be produced.

Afterwards the imager with the microlenses 12 is packaged (block 40). Thereafter, the microlenses may be exposed to conventional temperatures utilized for mass reflowing surface mount packages without adversely affecting the optical characteristics of the lenses. In some embodiments, the microlenses are adapted to withstand temperatures of at least 225° C. for at least one minute and in some cases at least two minutes. Not only is the transmissivity substantially unchanged in some embodiments, but the shape of the lens may be substantially unaffected as well.

Figure 5:
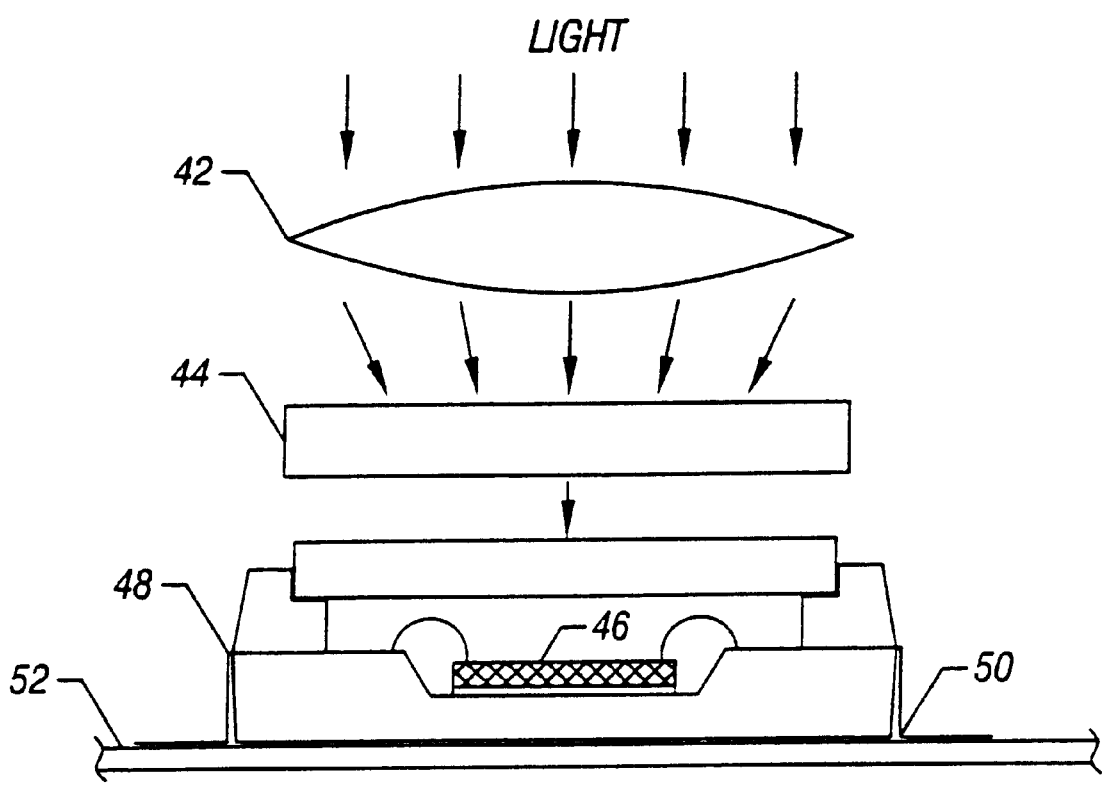
FIG. 5 shows a device in use in accordance with one embodiment of the invention.

Referring now to FIG. 5, a completed microlens array 44 may be positioned atop a photosensitive device 46 contained in a surface mount package 48. An external refractive lens 42 may focus light through the microlens array 44 onto the photosensitive device 46. In one embodiment of the invention, a windowed quad flat package 48 may be secured to a circuit board 52 using the leads 50 in accordance with conventional surface mount packaging techniques. Upon the application of heat, the leads 50 bond the package 48 to the circuit board 52. This may be done without adversely affecting the optical performance of the microlens array 44.

While the present invention has been described with respect to a limited number of embodiments, those skilled in the art will appreciate numerous modifications and variations therefrom. It is intended that the appended claims cover all such modifications and variations as fall within the true spirit and scope of the present invention.

What is claimed is:

1. A method of forming a heat stable microlens comprising:

bleaching a microlens forming material using deep ultraviolet radiation having a wavelength above about 400 nanometers; and hard baking said material at a temperature and time sufficient to enable said material to be heat stable at temperatures on the order of 200° C. for least two minutes.

2. The method of claim 1 including hard baking said material for at least two minutes at a temperature of at least 200° C.

3. The method of claim 1 including bleaching said material for about 10 seconds.

* * * * *